(12) United States Patent
Puzey

(10) Patent No.: US 6,351,482 B1
(45) Date of Patent: Feb. 26, 2002

(54) VARIABLE REFLECTIVITY MIRROR FOR INCREASING AVAILABLE OUTPUT POWER OF A LASER

(75) Inventor: Kenneth A. Puzey, Essex Junction, VT (US)

(73) Assignee: Tera Comm Research, Inc, Essex Junction, VT (US)

(*) Notice: Subject to any disclaimer, the term of this patent is extended or adjusted under 35 U.S.C. 154(b) by 0 days.

(21) Appl. No.: 09/210,931

(22) Filed: Dec. 15, 1998

(51) Int. Cl.$^7$ .............................. H01S 3/02; H01S 3/34; H01S 5/183

(52) U.S. Cl. .............................. 372/99; 372/46; 372/53; 372/55; 372/92; 372/96

(58) Field of Search .............................. 372/99, 92, 96, 372/46, 55, 53

(56) References Cited

U.S. PATENT DOCUMENTS

| | | | |
|---|---|---|---|
| 4,295,104 A | 10/1981 | Burnham | |
| 4,858,240 A | 8/1989 | Pöhler et al. | 372/10 |
| 5,015,619 A | 5/1991 | Wang | 505/1 |
| 5,036,042 A | 7/1991 | Hed | 350/321 |
| 5,110,792 A | 5/1992 | Nakayama et al. | 505/1 |
| 5,210,637 A | 5/1993 | Puzey | 359/263 |
| 5,323,410 A | 6/1994 | Masumoto et al. | 372/43 |
| 5,328,893 A | 7/1994 | Sun et al. | 505/210 |
| 5,381,431 A | 1/1995 | Zayhowski | 372/25 |
| 5,556,015 A | 9/1996 | Vincent | 224/328 |
| 5,568,302 A | 10/1996 | Puzey | 359/157 |
| 5,570,386 A | 10/1996 | Capasso et al. | 372/46 |
| 5,600,465 A | 2/1997 | Puzey | 359/115 |
| 5,768,002 A | 7/1998 | Puzey | 359/245 |

OTHER PUBLICATIONS

Designers Guide to Fiber Optics;, Transmitters and Receivers; "Data Rates and Encoding Formats"; pp. 144–147. (No Date).

L.J. Olafsen et al.; "Near Room Temperature Mid Infrared Interband Cascade Laser"; Applied Physics Letters, vol. 72, No. 19; May 11, 1998.

J. Faist et al., Short Wavelength ($\lambda$–3.4$\mu$M) Quantum Cascade Laster Based on Strained Compensated INGAAS/ALLNAS; Applied Physics Letters vol. 72, No. 6, Feb. 9, 1998; pp680–682.

J. Ch. Garcia, et al.; Epitaxially Stacked Lasers with Esaki Junctions; A Bipolar Cascade Laser; Applied Physics Ltrs.; vol 71, No. 26; Dec. 29, 1997; pp. 3752–3754.

B. Levi; Quantum Cascade Laser Makes Progress; Physics Today, vol. 49 8/96, pp. 21.

J. Faist et al..; Quantum Cascade Laser; Science; vol 264, Apr. 22, 1994, pp. 553–556.

C. Gmachl et al.; Continuous–Wave and High–Power Pulsed Operation of Index–Coupled Distributed Feedback Quantum Cascade Laser AT$\lambda \approx 8.5 \mu$M.; Applied Physics Letters; vol. 72, No. 12; Mar. 23, 1998; pp. 1430–1432.

(List continued on next page.)

Primary Examiner—James W. Davie
(74) Attorney, Agent, or Firm—Michael Pritzkau; Yoriko Morita (57) ABSTRACT

Output for a laser is greatly increased by altering the transmitivity of a superconductor layer which serves as one of the mirrors of the laser cavity. The superconductor layer is switched between a superconductive state, having reflectivity of one, and a non-superconductive state, having a reflectivity of less than one. When the mirror is in its superconducting state, output power is decreased and power in the cavity is increased, and when the mirror is in its non-superconducting state, output power of the laser is increased and power in the cavity decreases.

42 Claims, 6 Drawing Sheets

OTHER PUBLICATIONS

S. Slivken, et al.; Gas–Source Molecular Beam Epitaxy Growth of an 8.5µM Quantum Cascade Laser; Appl. Phys. Ltt., vol. 71, No. 18, Nov. 3, 1997; pp. 2593–2595.

N. Wingreen et al; Quantum–Dot Cascade Laser; Proposal for an Ultralow–Threshold Semiconductor Laser: IEEE Jrnl of Quan. Elect. vol. 33 No. 7; 7/97; pp. 1170–1173.

Wiese, P., et al., "Far–infrared fabry perot filter of high transmission with high–$T_c$ superconductor reflectors," *International Journal of Infrared and Millimeter Waves*, vol. 13, No. 1, 1992, pp. 65–70.

Renk, K. F., et al., "Use of high $T_c$ superconductors for far–infrared fabry–perot resonators," Sep. 5, 1990.

Malon, C. G., et al., "Optimized design of far–infrared fabry–perot resonators fabricated from $Yba_2Cu_3O_7$," *IEEE*, 1993, pp. 2852–2855.

Pechen, E. V., et al., "Far–infrared fabry–perot resonator with high $T_c$ $Yba_2Cu_3O_{7-\delta}$ films on silicon plates," Aug. 10, 1992.

Koechner, W., "Solid–State Laser Engineering $4^{th}$ Edition", Springer Verlag, Berlin, XP002139618, pp. 496–499, 1996 (No Month).

Dods, S. R. A. and Ogura, M., "Q–Modulation of a Surface Emitting Laser and an Integrated Detuned Cavity", *IEEE Journal of Quantum Electronics*, Vo. 30, No. 5, pp. 1204–1211, May 1, 1994.

VARIABLE REFLECTIVITY MIRROR FOR INCREASING AVAILABLE OUTPUT POWER OF A LASER

BACKGROUND OF THE INVENTION

1. Field of the Invention

The present invention generally relates to lasers and, more particularly, to a new laser construction that produces an output power pulse that greatly exceeds the previous optimal power of the prior art.

2. Background Description

Lasers consist of an optical cavity that provides feedback and a gain medium that provides optical amplification. Previously, lasers have used mirrors (dielectric or metallic) to build the optical cavity, such as a Fabry-Perot oscillator. Unfortunately, these mirrors have a fixed reflectivity. This necessitates choosing the reflectivity of the mirror to balance the amount of output coupling against the amount of feedback.

Losses in a laser can be grouped into two different categories: a) non-useful losses due to diffraction, scattering, and absorption; and b) useful loss due to coupling of output power through a partially transmissive mirror. It is obvious that optical output power is maximized by minimizing the first group of losses. However, selecting a reflectivity that optimizes output is more complicated. At first it would appear that a mirror reflectivity of one would be desirable. Although this maximizes optical feedback, amplification, and energy build up in the cavity, it also reduces optical output to zero. Recall that in the absence of absorption, the mirror reflectivity and transmitivity must sum to one (conservation of energy).

$$T = 1 - R \quad (1)$$

where T is transmitivity and R is reflectivity.

Reducing the optical reflectivity to zero is also suboptimal as it reduces feedback, energy build up in the cavity and the benefit of multiple passes through the gain medium is lost. The result is low optical output and the laser does not lase. Currently, the reflectivity must be carefully selected to achieve maximum output power. This optimal reflectivity must balance the benefits of lower reflectivity (high percentage output, low gain) against higher reflectivity (lower percentage output, higher gain).

The maximum output power is obtained when $$T = -L + \sqrt{gL_i}, \quad (2)$$

where T is the mirror transmitivity, g is the unsaturated gain per pass, and $L_i$ is the non-useful fraction of intensity lost per pass. $L_i$ is given by $$L_i = L - T, \quad (3)$$

where L is the total loss per pass given by $$L = 1 - R_1 R_2 e^{-\alpha l}, \quad (4)$$

where $R_1$ is the reflectivity of the first mirror, $R_2$ is the reflectivity of the second mirror, $\alpha$ is the absorption loss per unit length, and l is the length of the cavity. The optimal power output is given by $$P = IA(\sqrt{g} - \sqrt{L_i})^2, \quad (5)$$

where I is the saturation intensity, and A is the cross sectional cavity area.

Q switching is a widely used method to create much larger pulses than usual laser operation allows. This method increases the population inversion inside the laser cavity either by A) removing the cavity feedback or B) increasing the cavity losses. While in this low Q state normal pumping increases the population inversion inside the cavity. When the population inversion has reached the desired levels the cavity feedback is restored or the source of increased loss is removed. Next, the laser begins to oscillate and the energy stored in the population inversion is converted into photons resulting in a high energy pulse. This pulse rapidly depletes the stored population inversion. Typical pulses are only a few tens of nanoseconds long.

Q-switched lasers have many practical applications where brief but intense pulses are required, including: range finding, cutting, drilling, and nonlinear optical studies.

Specific methods of Q-switching include:

1. Rotating mirrors—a mirror or 90 degree prism is mounted to a motor shaft and spun so that it is only aligned with the other cavity mirror for a brief time. This method suffers from the slow speed of mechanical devices.

2. Electro-optic—a crystal that becomes birefringent upon application of a voltage is placed in the laser cavity along with polarizing elements. This is the fastest method and can achieve pulses of less than 10 nanoseconds. Disadvantages of this method include: it requires a high speed, high voltage electrical pulse source; these intense electrical pulses can produce severe electrical interference in nearby equipment; and the optical crystal and polarizers are optically lossy even in the high Q state and are subject to optical damage.

3. Acoustooptic—an acousto optic modulator is used to diffract light out of the cavity for the low Q state. These modulators have low insertion losses. However, this method is limited to kHz repetition rates.

4. Passive saturable absorber—an absorbing medium that is easily saturated is used to provide the increased loss. When the population inversion builds up enough that the gain exceeds the saturated loss the laser lases, depleting the population inversion. An organic dye is often used as the saturable absorber.

5. Thin film saturable absorber—a thin metallic film is used as the absorber until light in the laser cavity evaporates or burns it away. This is a one shot type of method.

The rate equation analysis can be depicted as:

$$dn/dt = KnN - Ycn, \text{ and}$$

$$dN/dt = Rp - N/T2 - 2*KnN,$$

where n(t) is the cavity photon number, N(t) is the inverted population difference, $Yc = 1Tc$ is the cavity decay rate, Rp is the pumping rate, T2 is the excited electron lifetime, the reciprocal of the decay rate, and K is the coupling coefficient between atoms and photons. 2* is a constant between 2 and 1. This constant is 2 for lasers with only two transition levels or for multilevel system where the lower transition level has a long lifetime. Siegman refers to these as "bottle necked" systems. The constant is 1 for systems that have very short lifetimes for the lower level transition.

During the pumping interval the equations can be simplified. No oscillation occurs, so n=0 during this period, reducing the second rate equation to $$dN/dt = Rp - N/T2,$$

which has a solution $N(t) = RpT2\{1 - e^{-t/t2}\}$. Thus, the inverted population approaches a maximum value of RpT2 exponentially. This value RpT2 is also the maximum number of photons that can be produced in the pulse when it is switched. Generally for proper operation the gain medium must have a reasonably long lifetime in the excited state. Note that Q switching is not practical for most visible gas lasers or organic dye lasers as the population lifetimes are a few nanoseconds. The time over which a population can be built up and stored is just too short for a pulse to develop.

SUMMARY OF THE INVENTION

It is therefore an object of the present invention to provide a variable reflectivity mirror to increase the amount of available laser output power.

It is also an object to provide high speed optical pulses from a laser.

According to the invention, output for a laser is greatly increased by altering the transmitivity of a superconductor layer which serves as one of the mirrors of the laser cavity. The superconductor layer is switched between a superconductive state, having a high reflectivity, and a non-superconductive state, having a lower reflectivity. When the mirror is in its superconducting state, power in the laser cavity will reach a high level and light output will be low, and when the mirror is in its non-superconducting state, power output will be high and the cavity power will be lowered.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

The present invention employs a variable reflectivity mirror to increase the amount of available output power. Such a mirror may be implemented by using a superconducting material for the mirror. A superconducting mirror has a reflectivity of one in the superconducting state. The reflectivity of a superconducting mirror may be lowered by causing it to enter a non-superconducting state. A superconductor can be made to enter a non-superconducting state by raising its temperature using a switched heating element, an applied magnetic field using a switched coil, or a switched current to raise the operating condition above a critical level. The superconducting state can be reentered by lowering the temperature, the applied magnetic field, or current below the critical level.

With the present invention, when the mirror is in the superconducting state, the reflectivity is one and energy is amplified and built up in the cavity. When optical output is desired, the mirror is caused to enter its non-superconducting state lowering its reflectivity (increasing its transmitivity). In this manner, much higher output powers can be achieved than were previously possible. However, as the optical power is drained away output power drops with time.

In the superconducting state, the mirror reflectivity is one. In the non-superconducting state, the reflectivity is typically 0.94. A typical non-useful loss is 1%. A typical unsaturated gain is 70.7%.

For these typical values, when the mirrors are in the superconducting state, power in the cavity will be 69.7 times the laser saturation power. When the mirror is first switched to the non-superconducting state, the output power will be 59.7 times the saturation power, greatly exceeding the previous optimal power of the prior art. If the mirror is left in the non-superconducting state the power in the cavity will reach equilibrium at a power of 9.1 times the saturation power, with a power output of 7.8 times the saturation power. Note that this is equivalent to the optimal power of the prior art.

This invention would be extremely useful in fiber optic transmission systems as the mirror reflectivity can be rapidly changed using electrical current. For example, if a superconducting mirror is used to modulate light externally as described in my prior U.S. Pat. No. 5,210,637, the maximum output that could be achieved in our example would be 7.8×0.06=0.468 times the saturation power. This invention, which incorporates a reflectivity switching mirror as part of the laser cavity, has an output power of 59.7 to 7.8 times the saturation power. Thus, the present invention gives high speed optical pulses that are 127 to 16 times more powerful than prior art.

Laser Theory

A more detailed analysis follows using a round trip scattering loss of 7% and an unsaturated gain of 70.7%.

Figure 1:
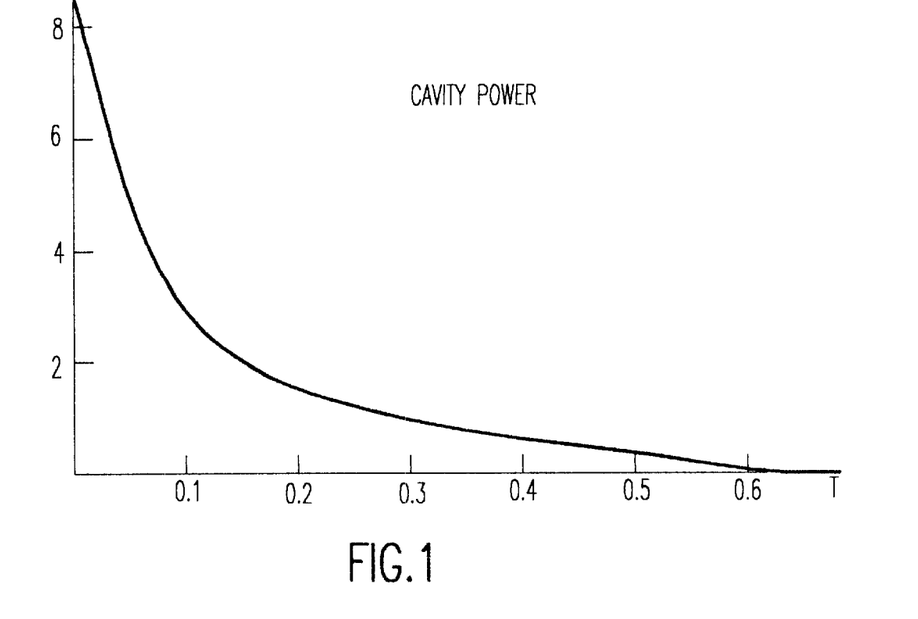
FIG. 1 is a graph comparing power in the cavity to transmission.

The power in the optical cavity, $P_c$, is given by, $$P_C = \left(\frac{g}{L_i + T} - 1\right) P_S, \tag{6}$$

where g is the unsaturated gain per pass, $L_i$ is the round trip loss per pass from absorption, diffraction, and scattering; $P_s$ is the saturation power, and T is the transmission coefficient of the mirror. It is obvious that the power in the cavity increases with decreasing mirror transmission. This is shown in FIG. 1. FIG. 1 is a graph comparing optical power in the cavity to mirror transmission. As can be seen, as transmission increases, power in the cavity decreases. The output power, $P_O$, is given by, $$P_O = \left(\frac{T}{T+L_i}\right)P_C. \quad (7)$$

Figure 2:
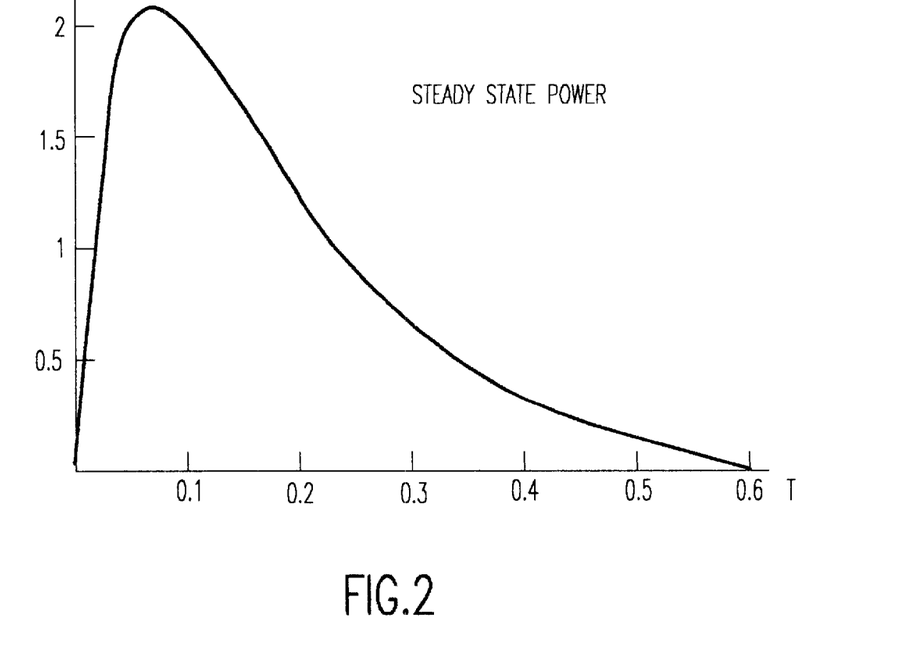
FIG. 2 is a graph comparing output power to transmission.

A plot of the power coupled out of the laser is shown in FIG. 2. An optimal power output is achieved at twice the saturation power for a fixed transmission of 6%.

A superconducting thin film may be employed as a variable reflectivity mirror to increase the amount of available output power. A superconducting mirror has a reflectivity of one in the superconducting state. When the mirror is in the superconducting state, the reflectivity is one and energy is amplified and built up in the cavity. When optical output is desired, the mirror is caused to enter its non-superconducting state lowering its reflectivity (increasing its transmitivity). In this manner, much higher output powers can be achieved than were previously possible. However, as the optical power is drained away output power drops with time. This approach represents a new coupling mechanism for lasers.

The instantaneous power available from the present invention is given by $$P_n = \left(\frac{g}{L_i} - 1\right)\left(\frac{T}{T+L_i}\right)P_s, \quad (8)$$

where T is the transmission of the superconducting mirror in the normal state.

Using T=0 for the superconducting state and T=0.06 for the normal state and plugging into equations (6) and (7), the output power for this new coupling mechanism can be calculated. When the mirrors are in the superconducting state, power in the cavity will be 9.1 times the laser saturation power and, output power is zero. When the mirror is first switched to the non-superconducting state, the output power will be 4.2 times the saturation power, greatly exceeding the previous optimal power of the prior art. If the mirror is left in the non-superconducting state, the power in the cavity will reach equilibrium at a power of 4.43 times the saturation power, with a power output of 2.0 times the saturation power. Note that this is equivalent to the optimal power of the prior art. In addition, this arrangement is superior to modulating the light externally. In the example, external modulation would be 2.0×0.06=0.12 times the saturation power.

Using a superconducting switching mirror as one of the mirrors in a laser cavity has obvious benefits for high power pulses. A superconducting switching mirror may be used in either a gas laser or solid state laser. This concept is very useful when combined with surface emitting semiconductor lasers as well. Note that a large number of these devices may be integrated onto a single chip. There are several basic types of vertical cavity surface emitting lasers (VCSELs). Several embodiments are shown in drawing FIGS. 3 to 7.

Figure 3:
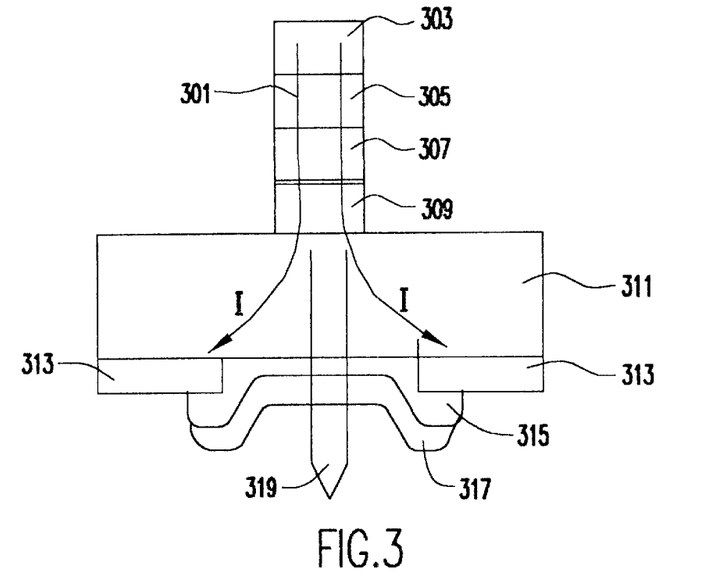
FIG. 3 is a cross-sectional view showing an embodiment of the invention for the basic geometry of a vertical cavity surface emitting laser (VCSEL)

FIG. 3 shows a cross-sectional view of the basic geometry of a VCSEL. In order to fabricate two-dimensional arrays of laser devices, it is beneficial to construct the laser cavity perpendicular to the plane of the semiconductor wafer. The principles of operation of a VCSEL are the same as for a conventional edge emitting laser. Current 301 is injected vertically from a metal contact 303 (which also acts as a mirror of the cavity) through a p-i-n gain layer, comprised of a p-doped region 305, an intrinsic region 307, and an n-doped region 309. Current flows through the wafer 311 then out through contacts 313 on the bottom of the wafer 311. In the area underneath the p-i-n structure, a dielectric layer 315 and a superconducting layer 317 are deposited. The dielectric layer 315 insulates the superconductor 317 from electrical currents 301 used to power the laser. The superconductor 317 acts as the other mirror of the laser cavity. The structure is similar to that of a conventional VCSEL except that this design has one of its reflectors replaced by a dielectric 315 and superconducting layer 317.

In operation, light output 319 results when the superconductor is driven into its normal state. A superconductor can be driven into the normal state by the application of an electrical current, or a magnetic field, or by raising its temperature.

Figure 4:
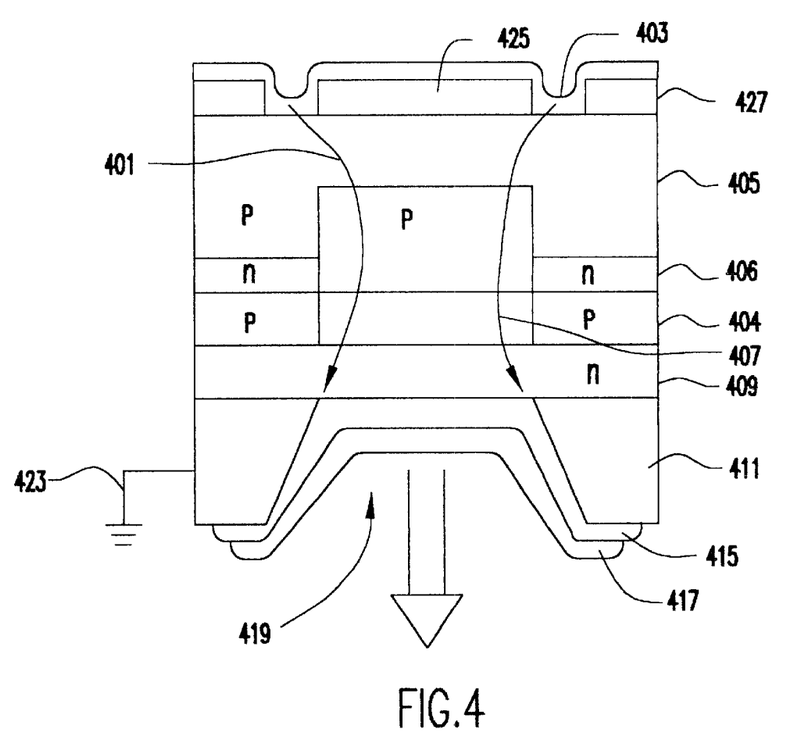
FIG. 4 is a cross-sectional view showing an embodiment of the invention for an etched well type VCSEL.

FIG. 4 is a cross-sectional view of VCSEL having an etched well. A p-type active region 407 is used in this device. An upper p-type hole injection layer 404 is etched and overgrown with an n-type current blocking layer 406 and a p-type contact layer 405. The upper mirror is a metal contact 403 or, optionally, dielectric mirror 425. The lower reflector is a superconducting layer 417 that is electrically insulated from the substrate 411 by a dielectric 415. In this embodiment a ground 423 is used.

The optional dielectric mirror 425 is used to enhance the reflectivity of the upper reflector if necessary. The dielectric 427 acts as an electrical insulator restricting the current 401 to flow in the contact region. Layer 406 is a current blocking layer that forces the current to flow through the active region. Layer 404 helps to confine light in the horizontal direction via its index of refraction difference with the active region.

Figure 5:
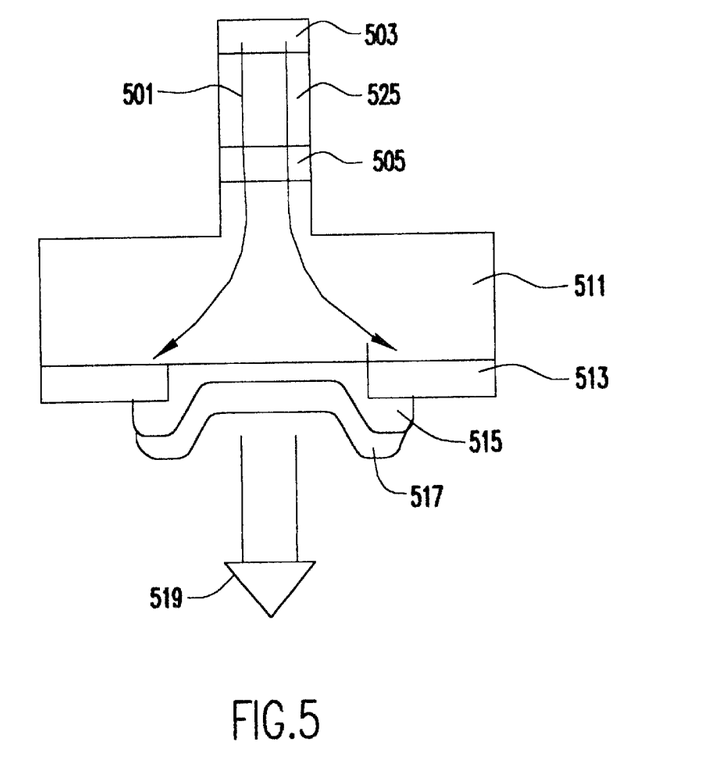
FIG. 5 is a cross-sectional view showing an embodiment of the invention for a bottom emitting mesa type VCSEL.
Figure 6:
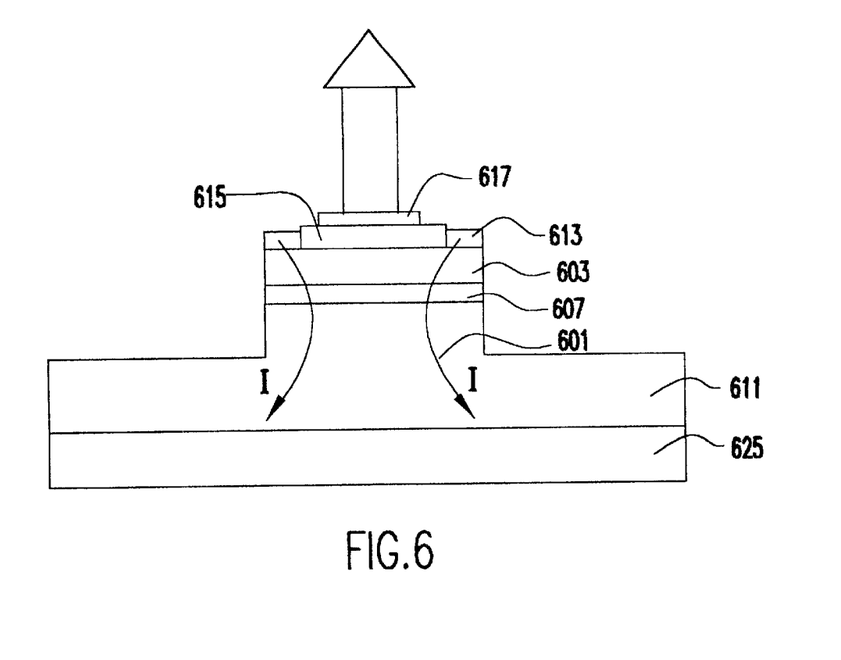
FIG. 6 is a cross-sectional view showing an embodiment of the invention for a top emitting mesa type VCSEL.

FIGS. 5 and 6 show cross-sectional views of emitting mesa type VCSELs. A bottom emitting mesa type VCSEL is shown in FIG. 5. For transparent substrates, a bottom emitting mesa is possible and a superconductor 517 is used as the bottom reflector. The superconductor 517 is insulated by a dielectric layer 515. The current flow 501 passes through a contact metal 503, an optional dielectric mirror 525, an active region 505 and the substrate 511 then out through contacts 513.

In the top emitting device, shown in FIG. 6, current 601 must be injected through a windowed contact 613, such as an annulus, or through a transparent conducting material 603, such as indium tin oxide. The dielectric layer 615 insulates the superconductor 617 from the contact 613 or the transparent conducting material. The current passes through active region 607, the substrate 611 to a lower reflector 625, which serves as the bottom contact.

Figure 7:
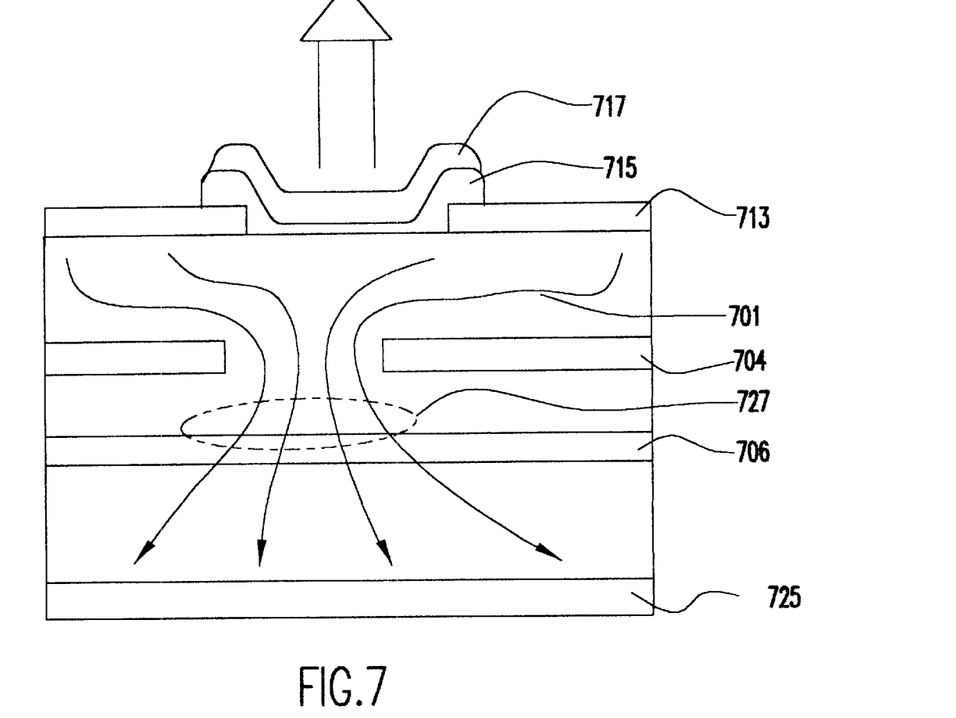
FIG. 7 is a cross-sectional view shows an embodiment of the invention for an implant type VCSEL.

FIG. 7 shows a cross sectional view of an implant type VCSEL. Protons or oxygen ions are used to form an implant region 704 producing a buried current blocking layer to concentrate current 701 through a small area 727 of the active layer 706. A dielectric or metal mirror is used for the bottom mirror 725. A superconducting mirror 717 electrically insulated by a dielectric 715 is used for the top mirror.

As mentioned previously, when the superconductor is in the reflective state energy builds up in the cavity. When an electrical current is passed through the superconducting mirror, it becomes partially transmissive thus dumping the cavity energy as a high power pulse. The power of the pulse drops with time as the excess cavity energy is drained away. However, the power output of the laser will stabilize at some lower level, which may be equivalent to the optimal output power of lasers in the prior art. When the electrical current is removed the mirror reflectivity is restored charging the laser for another high power pulse, and the power output is dropped to zero.

These optical pulses can be used to carry digital data. In fact, the electrical pulses used to create the optical pulses can be kept very short so as not to completely drain the excess cavity energy. This practice can be called "sub-pulsing". Sub-pulsing works well with many digital transmission schemes, including clock and data signals. For example, Return to Zero (RZ) coding or Manchester encoding. These code schemes are illustrated in *The Designer's Guide to Fiber Optics*, $1^{st}$ edition, page 146, published by AMP. In these code schemes the laser would spend at least 50% of each bit period charging. This is advantageous because frequent charging would allow the laser to maintain a high cavity energy and thus high power pulsed output. The Manchester code is preferred because it encodes the clock with the data thus simplifying data recovery of the receiving end.

In order for the superconductor to work properly as a mirror the photon energy must not be greater than the band gap of the superconductor. Therefore gain media for low photon energy are particularly useful in the present invention. Such gain media include lead salts and Quantum Cascade structures. Quantum Cascade structures use bandgap engineering techniques to allow common semiconductor materials to emit lower energy photons than were previously possible. Quantum Cascade structures are described in L. J. Olafsen et al. "Near-room-temperature mid-infrared interband cascade laser," *Applied Physics Letters*, vol. 72, no. 19, May 11, 1998, pages 2370–2372; J. Faist et al. "Short wavelength (lambda~2.4 microns) quantum cascade laser based on strained compensated InGaAs/AlInAs," *Applied Physics Letter*, vol. 72, no. 6, Feb. 9, 1998, pages 680–682; and J. Garcia et al. "Epitaxially stacked lasers with Esaki junctions: A bipolar cascade laser," *Applied Physics Letters*, vol. 71, no. 26, Dec. 29, 1997, pages 3752–3754. An antireflection coating can be deposited on the end-face of a quantum cascade laser using chemical vapor deposition, plasma arc deposition or other commonly practiced methods. Then superconducting mirrors can be used to form an external Fabry-Perot cavity around the Quantum cascade gain medium.

The present invention may be compared to a Q-switching laser. The present invention is analogous in that it stores up energy in the cavity to be used in a high power pulse. However, it differs in that it stores this energy in the form of photons in the cavity, not high energy electrons. As a result, this stored energy is available more rapidly. Q-switching must convert the energy from high energy electrons into photons, the present invention does not suffer from this delay. Furthermore, the energy stored in the cavity can be limited by the density of electrons, not so with the present invention. Another difference between Q switching and the present invention is that Q switching produces a pulse by going from a high loss state to a low loss state. The present invention produces a pulse by going from a low loss state to a high loss state. With the present invention pulse speeds can have durations in the picosecond range.

Because the present invention stores energy as photons instead of as a population inversion it is not subject to the limitations of the excited state lifetime. In fact, the photon energy stored in the pulse is equal to RpTc, where Tc is the cavity lifetime. The cavity lifetime is the cavity period divided by the cavity loss per pass. The cavity period T=2nL/c, where L is the length of the cavity, n is the index of refraction of the gain medium, and c is the speed of light. Note that the cavity loss per pass in the charging state for the present invention is very low. That is because the mirror is in a high reflectivity state and loss is essentially limited to the internal losses. Internal losses can be as low as 1% per pass. It is an object of the present invention to produce high energy pulses from lasers that have gain mediums with short excited electron lifetimes.

A comparison of Q-switching and the present invention is shown in the table below.

| | Q-switching | present invention |
|---|---|---|
| energy stored as | population inversion (high energy electrons) | photons |
| energy storage limits | dependent on atomic density and lifetime of excited electrons | dependent on cavity lifetime (cavity length and internal losses). This is a higher limit in most cases. |
| Charging state produced by | increasing optical loss in cavity, allowing population inversion to increase | decreasing optical loss allowing photon count to increase inside cavity |
| optical pulse produced by | decreasing optical loss in cavity, converting population inversion into photons | increasing optical loss (lowering mirror reflectivity), allowing photons to escape laser cavity as useful output |
| Pulse delay | optical output is delayed until stimulated emission converts population inversion into photons. Approximated delays, 50 nanoseconds for a typical Nd:YAG laser, 3 microseconds for a $CO_2$ laser | optical output available immediately |
| pulse duration | function of cavity lifetime which is long in low loss state | function of cavity lifetime, which is short in high loss state |
| peak power (energy/pulse duration) | low | high (higher energy and shorter pulse duration) |

Figure 8:
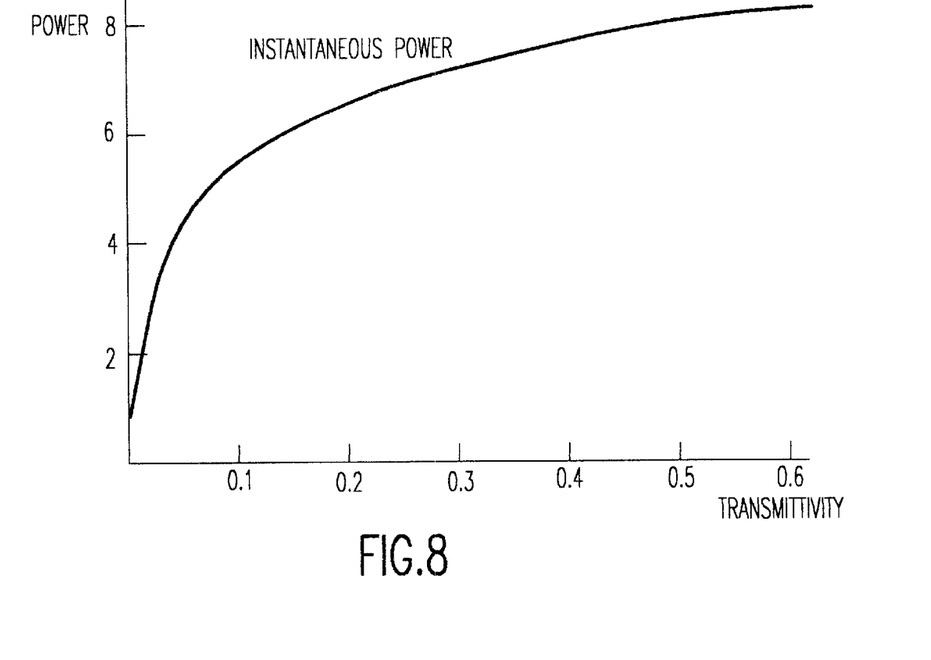
FIG. 8 is a graph comparing instantaneous power to transmission for the inventive laser.
Figure 9:
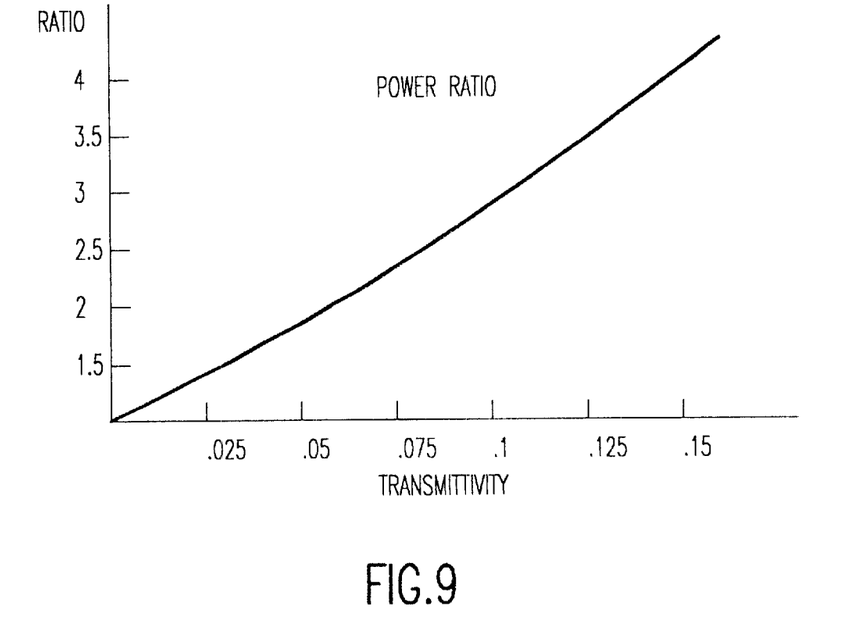
FIGS. 9 and 10 are graphs showing the ratio of power output compared to transmitivity for the inventive and conventional lasers.
Figure 10:
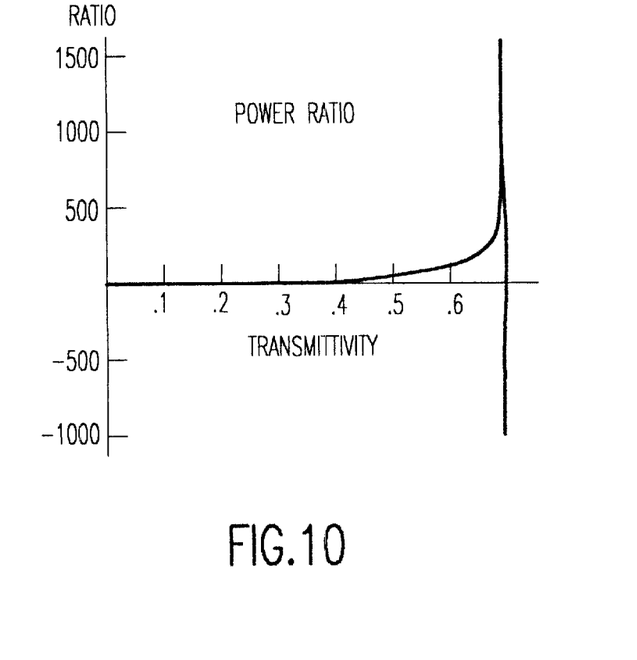

The graphs shown in FIGS. 8, 9 and 10 illustrate the comparisons between the inventive laser and the prior art. FIG. 8 is a graph showing how much power is instantaneously available with the inventive laser. As can be seen, power increases as transmitivity increases. Noticeable increases in power output stop at about a transmitivity of 0.5.

Figure 11:
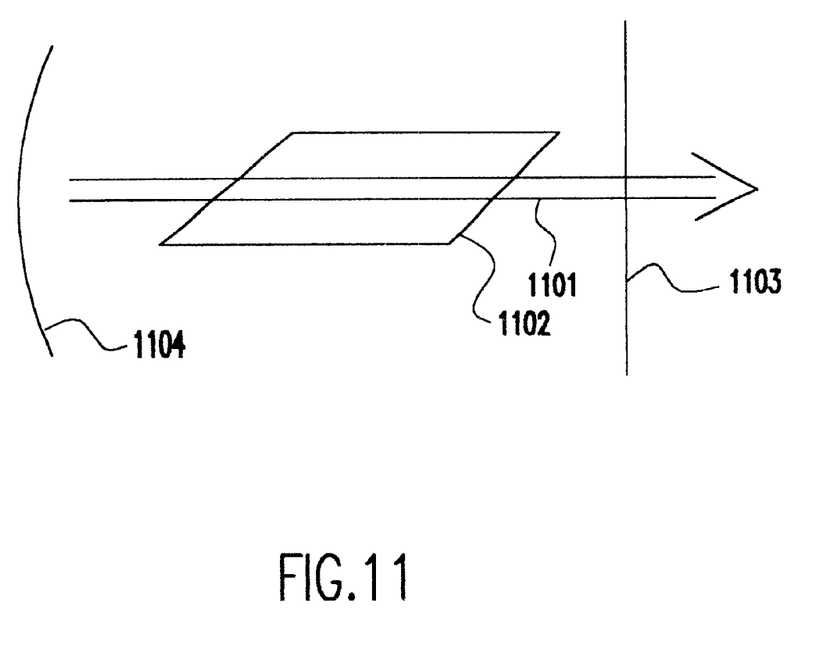
FIG. 11 is a schematic showing the inventive laser in operation.

The graphs shown in FIGS. 9 and 10 show the ratio of power output compared to transmitivity for the inventive and conventional lasers. As can be seen in FIG. 9, the amount of power available to the inventive laser increases faster than conventional lasers, such that at a transmitivity of 15%, the inventive laser is four times more powerful. FIG. 10 is an expansion of FIG. 9, showing the comparisons to a transmitivity of 0.6. The ratio increases towards infinity at 60% transmission because at this point the power output of conventional lasers drops off FIG. 11 is a schematic of the inventive laser which summarizes its operation. The output laser beam 1101 passes through any gain medium 1102, such as a gas cell or quantum cascade structure, and through the superconducting film 1103 when the film is in a nonsuperconducting state. When the film 1103 is in a superconducting state, the beam 1101 is reflected back to mirror 1104. While the film 1103 remains in a superconducting state, power builds up for the laser pulse. Thus, it will be appreciated by those skilled in the art that while the invention has been described in terms of preferred embodiments implemented in semiconductor lasers, the invention can be practiced using solid state lasers, gas lasers, lead salt lasers, quantum cascade lasers, and dye lasers within the spirit and scope of the appended claims.

Having thus described my invention, what I claim as new and desire to secure by Letters Patent is as follows:

1. A laser having an output and providing output radiation at the output, said laser comprising:

a first mirror;
a second mirror including a superconductor, said supercondutor being switchable between a superconducting state and a nonsuperconducting state such that said second mirror exhibits a first value of reflectivity, when the superconductor is in the superconducting state, and a second value of reflectivity, when said superconductor is in the nonsuperconducting state, said second mirror being confirmed to cooperate with said first mirror to define a laser cavity for containing energy;
a lasing medium disposed between said first and second mirrors for producing intracavity radiation within said laser cavity such that said energy is contained in said laser cavity in a form of photons; and
an arrangement for switching said superconductor between said superconducting state and said nonsuperconducting state such that, when said superconductor is in the superconducting state, said second mirror reflects substantially all of said intracavity radiation incident thereon into said laser cavity, and, when said superconductor is in the nonsuperconducting state, said second mirror directs at least a portion of said intracavity radiation to the output as the output radiation.

2. The laser of claim 1, wherein a current potentially exists in said lasing medium, and wherein the lasing medium includes a current conducting region for containing said current, said current conducting region including a plurality of layers of doped semiconductor material.

3. The laser of claim 2, wherein the laser is in a form of a vertical cavity surface emitting laser.

4. The laser of claim 2, further comprising a dielectric layer for insulating said superconductor from said current contained in the current conducting region.

5. The laser of claim 4, wherein said current conducting region further includes a gain layer, said gain layer including a p-doped region, an intrinsic region and an n-doped region.

6. The laser of claim 5, wherein said first mirror serves as a first electrical contact, and wherein the laser further includes a second electrical contact such that said current flows from said first electrical contact to said second electrical contact.

7. The laser of claim 4, wherein said current conducting region includes an etched well substrate, said etched well substrate including a p-type active region, an n-type current blocking layer and a p-type contact layer.

8. The laser of claim 7, wherein said first mirror serves as an electrical contact, and wherein said etched well substrate is electrically grounded such that said current flows from said electrical contact to said etched well substrate.

9. The laser of claim 8, wherein said first mirror includes a dielectric mirror and a metallic layer positioned in an overlying relationship to said dielectric mirror such that said current flows from said metallic layer to said etched well substrate.

10. The laser of claim 4, wherein said current conducting region includes an active region.

11. The laser of claim 10, wherein the laser is in a form of a bottom emitting device, wherein said first mirror serves as a first electrical contact, said laser further comprising a second electrical contact such that said current flows from said first electrical contact to said second electrical contact, and wherein the dielectric layer also serves to insulate the superconductor from the second electrical contact.

12. The laser of claim 10, wherein the laser is in a form of a top emitting device, wherein the first mirror serves as a first electrical contact, said laser further comprising a second electrical contact, said second electrical contact including an opening such that said dielectric layer is formed within said opening.

13. The laser of claim 10, wherein the laser is in a form of a top emitting device, wherein the first mirror serves as a first electrical contact, said laser further comprising a transparent layer serving as a second electrical contact such that the dielectric layer is disposed in an overlying relationship to said transparent layer.

14. The laser of claim 4, wherein said current conducting region includes a contact pad, an ion implant region and an active region, said ion implant region including an opening through which opening said active region is accessible.

15. The laser of claim 1 wherein said lasing medium includes a semiconductor.

16. The laser of claim 1 wherein said lasing medium includes a gas.

17. The laser of claim 1 wherein said lasing medium includes a solid state material.

18. The laser of claim 1 wherein said lasing medium includes a dye.

19. The laser of claim 18 wherein said dye is an organic dye.

20. The laser of claim 1 wherein said switching arrangement includes a switched current.

21. The laser of claim 1 wherein said switching arrangement includes a switched applied magnetic field.

22. The laser of claim 1 wherein said switching arrangement includes a switched applied temperature.

23. The laser of claim 1 wherein said lasing medium includes a low photon energy gain medium.

24. The laser of claim 23 wherein said low photon energy gain medium is a lead salt.

25. The laser of claim 23 wherein said low photon energy gain medium is a quantum cascade structure.

26. The laser of claim 2 wherein said current conducting region is in a form of a mesa.

27. The laser of claim 1 wherein said switching arrangement is configured to switch said superconductor between said superconducting state and said nonsuperconducting state such that said output radiation is in a form of a series of pulses.

28. The laser of claim 27 wherein said switching arrangement is further configured to switch said superconductor between said superconducting state and said nonsuperconducting state such that each of said pulses is less than one nanosecond in duration.

29. The laser of claim 27 wherein said switching arrangement is further configured to switch said superconductor between said superconducting state and said nonsuperconducting state such that said series of pulses contains information.

30. The laser of claim 29 wherein each one of said pulses represents a digital bit of information.

31. The laser of claim 29 wherein said switching arrangement is further configured to switch said superconductor between said superconducting state and said nonsuperconducting state such that each one of said pulses includes a series of sub-pulses, wherein each one of said sub-pulses represents a digital bit of information.

32. The laser of claim 29 wherein said information includes a clock signal and a data signal.

33. The laser of claim 32 wherein said information is in a forth of Manchester code.

34. A method of operating a laser having an output and including first and second mirrors defining a laser cavity for containing energy and a lasing medium disposed between said first and second mirrors for producing intracavity radiation within said laser cavity such that said energy is contained in said laser cavity in a form of photons, wherein said second mirror includes a superconductor, which superconductor is switchable between a superconducting state and a nonsuperconducting state such that said second mirror exhibits a first value of reflectivity, when the superconductor is in the superconducting state, and a second value of reflectivity, when said superconductor is in the nonsuperconducting state, said method comprising the steps of:

switching the superconductor to said superconducting state such that said second mirror reflects substantially all of said intracavity radiation into said laser cavity; and switching the superconductor to said nonsuperconducting state such that said second mirror directs at least a portion of said intracavity radiation to the output as the output radiation.

35. The method of claim 34, further comprising the step of alternating said step of switching the superconductor to said superconducting state and said step of switching the superconductor to said nonsuperconducting state such that said output radiation is in a form of a series of pulses.

36. The method of claim 35, wherein said alternating step includes the step of producing said series of pulses such that each of said pulses is less than one nanosecond in duration.

37. The method of claim 34 wherein said alternating step includes the step of encoding information onto said series of pulses.

38. The method of claim 37 wherein said encoding step includes the step of configuring said series of pulses to contain information.

39. The method of claim 38 wherein said encoding step further includes the step of configuring each one of said pulses to represent a digital bit of information.

40. The method of claim 38 wherein said encoding step further includes the step of configuring each one of said pulses to contain a series of sub-pulse such that each one of said sub-pulses represents a digital bit of information.

41. The method of claim 38 wherein said encoding step further includes the step of including a clock signal and a data signal in said information.

42. The method of claim 41 wherein said encoding step further includes the step of configuring said information in a form of Manchester code.

* * * * *